United States Patent
Knipe et al.

(10) Patent No.: US 10,566,140 B2
(45) Date of Patent: Feb. 18, 2020

(54) DVC UTILIZING MEMS RESISTIVE SWITCHES AND MIM CAPACITORS

(71) Applicant: CAVENDISH KINETICS, INC., San Jose, CA (US)

(72) Inventors: Richard L. Knipe, McKinney, TX (US); Charles G. Smith, Cambridge (NL); Roberto Gaddi, s-Hertogenbosch (NL); Robertus Petrus Van Kampen, S-Hertogenbosch (NL)

(73) Assignee: CAVENDISH KINETICS, INC., San Jose, CA (US)

( * ) Notice: Subject to any disclaimer, the term of this patent is extended or adjusted under 35 U.S.C. 154(b) by 422 days.

(21) Appl. No.: 14/904,855

(22) PCT Filed: Aug. 1, 2014

(86) PCT No.: PCT/US2014/049329
§ 371 (c)(1),
(2) Date: Jan. 13, 2016

(87) PCT Pub. No.: WO2015/017743
PCT Pub. Date: Feb. 5, 2015

(65) Prior Publication Data
US 2016/0172112 A1 Jun. 16, 2016

Related U.S. Application Data

(60) Provisional application No. 61/861,326, filed on Aug. 1, 2013.

(51) Int. Cl.
*H01G 5/00* (2006.01)
*H01G 5/40* (2006.01)
(Continued)

(52) U.S. Cl.
CPC ............ *H01G 5/40* (2013.01); *H01G 5/16* (2013.01); *H01G 5/18* (2013.01); *H01G 5/38* (2013.01);
(Continued)

(58) Field of Classification Search
USPC .......................................... 307/109
See application file for complete search history.

(56) References Cited

U.S. PATENT DOCUMENTS

| | | | |
|---|---|---|---|
| 7,663,196 B2 | 2/2010 | Liu et al. | |
| 2007/0278075 A1* | 12/2007 | Terano | H01P 1/127 200/181 |

(Continued)

FOREIGN PATENT DOCUMENTS

| | | |
|---|---|---|
| CN | 1581484 A | 2/2005 |
| JP | 2008278147 A | 11/2008 |

(Continued)

OTHER PUBLICATIONS

Chinese Office Action and Search Report in related application CN 2014800426765 dated Mar. 29, 2017.
(Continued)

*Primary Examiner* — Rexford N Barnie
*Assistant Examiner* — Dru Parries
(74) *Attorney, Agent, or Firm* — Patterson & Sheridan, LLP; Steven Versteeg

(57) ABSTRACT

The present invention generally relates to a MEMS DVC utilizing one or more MIM capacitors. The MIM capacitor may be disposed between the MEMS device and the RF pad or the MIM capacitor may be integrated into the MEMS device itself. The MIM capacitor ensures that a low resistance for the MEMS DVC is achieved.

8 Claims, 13 Drawing Sheets

(51) Int. Cl.
*H01H 59/00* (2006.01)
*H01G 5/38* (2006.01)
*H01G 5/18* (2006.01)
*H01G 5/16* (2006.01)
*H01L 49/02* (2006.01)

(52) U.S. Cl.
CPC ......... *H01H 59/0009* (2013.01); *H01L 28/20* (2013.01); *H01L 28/40* (2013.01)

(56) References Cited

U.S. PATENT DOCUMENTS

| | | | |
|---|---|---|---|
| 2008/0017489 A1* | 1/2008 | Kawakubo | H01H 1/50 200/181 |
| 2010/0328840 A1 | 12/2010 | Yamazaki | |
| 2011/0063774 A1 | 3/2011 | Ikehashi et al. | |
| 2012/0125747 A1* | 5/2012 | Chu | H01G 5/18 200/181 |
| 2013/0187169 A1 | 7/2013 | Taylor et al. | |

FOREIGN PATENT DOCUMENTS

| | | |
|---|---|---|
| JP | 2010245276 A | 10/2010 |
| JP | 2011009446 A | 1/2011 |
| JP | 2011-066150 A | 3/2011 |
| JP | 2011101227 A | 5/2011 |
| JP | 2012019307 A | 1/2012 |
| JP | 2013128138 A | 6/2013 |
| WO | 02/01584 A1 | 1/2002 |
| WO | 2006011239 A1 | 2/2006 |
| WO | 2013033613 A2 | 3/2013 |

OTHER PUBLICATIONS

Office Action issued in corresponding Japanese Patent Application No. 2016-531923, dated Apr. 3, 2018 (6 pages).
International Search Report issued in International Patent Application No. PCT/US2014/049329, dated Oct. 31, 2014 (3 pages).
International Preliminary Report on Patentability issued in International Patent Application No. PCT/US2014/049329, dated Feb. 2, 2016 (10 pages).

* cited by examiner

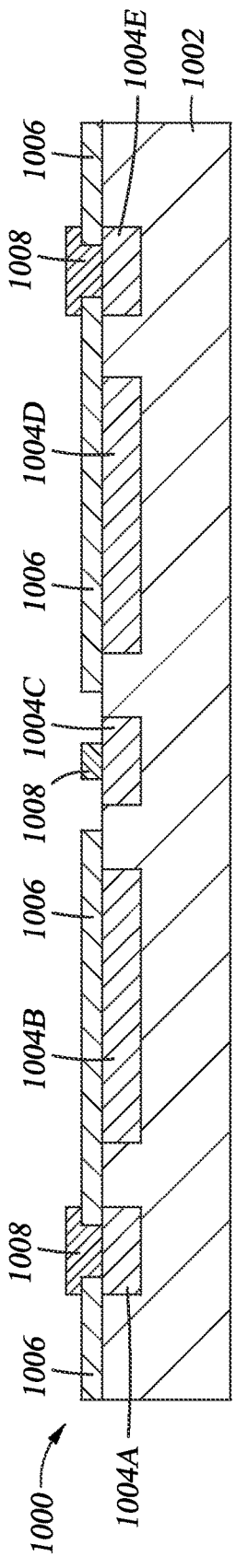
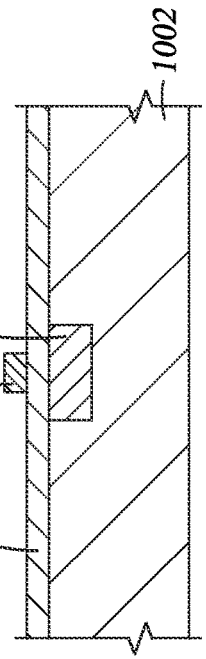
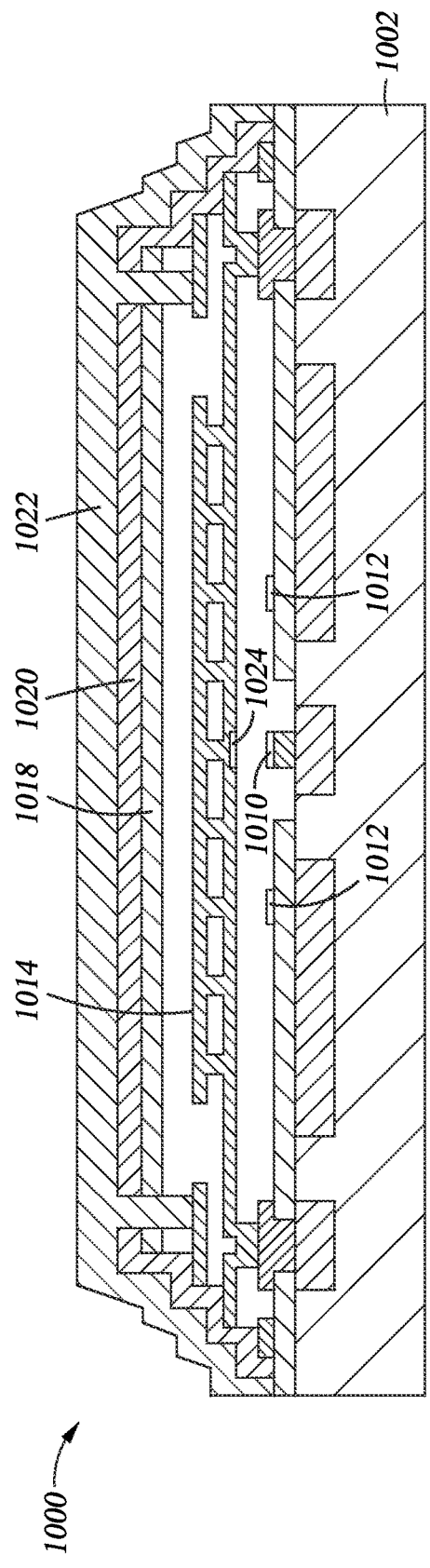
Fig. 10E
Fig. 10F
Fig. 10G

DVC UTILIZING MEMS RESISTIVE SWITCHES AND MIM CAPACITORS

BACKGROUND OF THE INVENTION

Field of the Invention

Embodiments of the present invention generally relate to a radio frequency (RF) digital variable capacitor (DVC) units for RF tuning and impedance matching.

Description of the Related Art

MEMS capacitors can show non linear behavior when operated as a capacitor. This is a problem for RF applications when signals transmitted at one frequency can leak into other frequency channels. One measure of this is the IP3 value or the value of input at which the third order nonlinearity times the input voltage or current is equal to the first order term times the input voltage or current.

With a MEMS capacitor, as the power increases on the RF line, an increasing voltage is dropped across the oxide between the RF line and the grounded MEMS cantilever. Even though the MEMS device may be in mechanical contact with the oxide layer, any roughness or asperities at that interface, result in a small change in the gap (between the RF electrode and the grounded MEMS) as a function of applied power. This change in gap results in a change in the maximum capacitance which in turn causes a shift in resonant frequency as a function of power. Thus a modulation in power can then lead to a modulation in frequency and to more signals being found outside the desired frequency window.

Therefore, there is a need in the art for a MEMS DVC with a consistent resonant frequency.

SUMMARY OF THE INVENTION

The present invention generally relates to a MEMS DVC utilizing one or more MIM capacitors. The MIM capacitor may be disposed between the MEMS device and the RF pad or the MIM capacitor may be integrated into the MEMS device itself. The MIM capacitor ensures that a low resistance for the MEMS DVC is achieved.

In one embodiment, a MEMS DVC comprises an RF pad disposed over a substrate; a MEMS device disposed over the substrate, the MEMS device having one or more switching elements disposed within a cavity formed over the substrate, the MEMS device further comprising an RF electrode disposed within the substrate, wherein the one or more switching elements are movable from a position in electrical contact with the RF electrode and a position spaced from the RF electrode; and a MIM capacitor disposed over the substrate, the MIM capacitor coupled between the RF pad and the MEMS device.

In another embodiment, a method of making a MEMS DVC comprises depositing a RF pad over a substrate; forming a MEMS device over the substrate, wherein the MEMS device comprises one or more switching elements disposed within a cavity formed over the substrate, wherein the MEMS device further comprises an RF electrode disposed within the substrate, and wherein the one or more switching elements are movable from a position in electrical contact with the RF electrode and a position spaced from the RF electrode; and forming a MIM capacitor over the substrate, wherein the MIM capacitor is electrically coupled to the RF pad and the RF electrode.

In another embodiment, a MEMS DVC comprises an RF pad disposed over a substrate; and a MEMS device disposed over the substrate. The MEMS device comprises one or more switching elements disposed within a cavity formed over the substrate; and a MIM capacitor, wherein the MIM capacitor is electrically coupled to the RF pad.

In another embodiment, a method of making a MEMS DVC comprises depositing a RF pad over a substrate; and forming a MEMS device within a cavity. The forming comprises forming a MIM capacitor over the substrate, wherein the MIM capacitor is coupled to the RF pad; and forming one or more switching elements over the substrate, wherein the one or more switching elements are movable from a position in electrical contact with the MIM capacitor and a position spaced from the MIM capacitor.

In another embodiment, a method of making a MEMS DVC comprises depositing a RF pad over a substrate and forming a MEMS device within a cavity. Te forming comprising: forming a MIM capacitor over the substrate, wherein the MIM capacitor is coupled to the RF pad; and forming one or more switching elements over the substrate, wherein the one or more switching elements are movable from a position in electrical contact with the MIM capacitor and a position spaced from the MIM capacitor. The method also comprising forming a variable resistor connecting the MIM capacitor to a reference potential.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 10A-10G are schematic illustrations of a MEMS DVC at various stages of fabrication according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
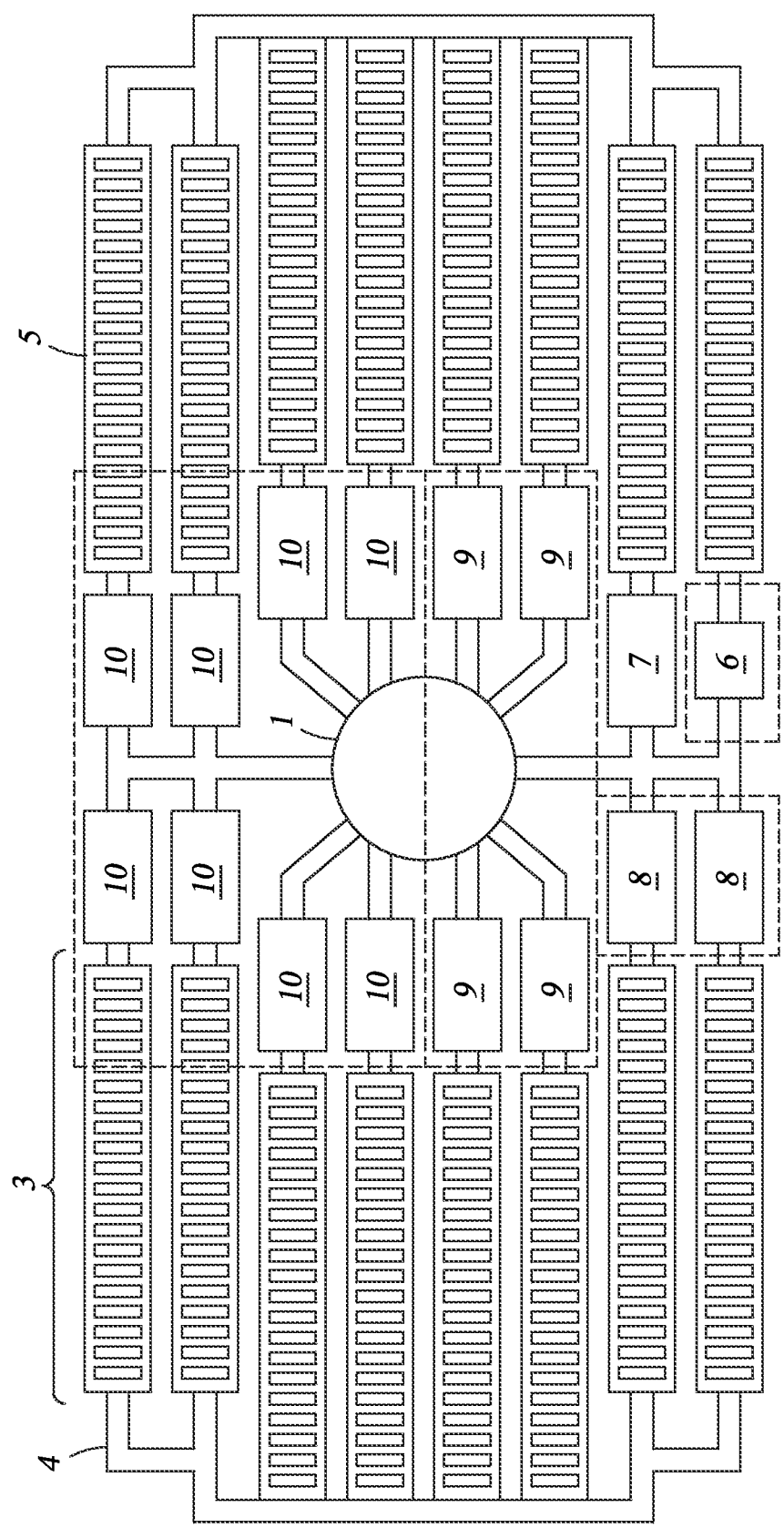
FIG. 1 is a schematic top view of a MEMS DVC according to one embodiment.

The present invention generally relates to a MEMS DVC utilizing one or more MIM capacitors. The MIM capacitor may be disposed between the MEMS device and the RF pad or the MIM capacitor may be integrated into the MEMS device itself. The MIM capacitor ensures that a low resistance for the MEMS DVC is achieved.

In this invention the MEMS capacitor is converted into a resistive switch which then switches in a metal insulator metal capacitor (MIM) device with conformal coatings of insulator and then metal over the first metal. Such a capacitor is more robust to high voltages and the high mechanical pressures induced by the voltage drop across the oxide, because the forces are evenly distributed over the interfaces. With the MEMS acting as a resistive switch, a low resistance is needed to get a good value for Q. For a Q of 100, 1% of the applied voltage drops across the resistive switch (0.4V for a 40V peak RF signal). With the correct design the switch resistance can be made independent of the applied RF power. To get a high Q at high frequency, it is important to get a low resistance between the switch and the MIM capacitor. To achieve a low resistance one normally requires a large MEMS device that can apply large forces to the contacts. The problem with a large MEMS device is that it switches slowly. To get round this, many small MEMS devices in parallel can be used to produce a low resistance. Although each contact has a reasonably large resistance, the total value is small. The advantage of this technique is that if the low resistance can be achieved and then a high Q digital variable capacitor can be made with good IP3 isolation. Although, ensuring that the resistance is low enough not to reduce the Q values at high frequencies and not to introduce other IP3 issues there can be challenging. There are issues with ensuring that there is no arcing during hot switching.

Coexistence of Ohmic and Capacitive MEMS Switches on the Same Flow

If looking to make a DVC product with a $C_{max}$ of 3 pF and a $C_{min}$ of 0.43 pF and with 5-bit resolution (or 32 steps), then switching a minimum capacitance of $8*10^{-14}$ F per step is needed. If a Q of 100 at 3 GHz is desired, an RC time constant of $1/(2 \text{ pi frequency} \times Q)$ or $1/(2 \text{ pi } 3\times10^{11})$ which is $1.3\times10^{-12}$s is needed. This leads to the requirement that the resistance needs to be less than about 16 Ohms.

In addition, the capacitance of the contact should be small in the open state so if the combined contact area of each switch is 1 micron by 1 micron and there are N in parallel, then the capacitance should be smaller than 1/100 of the step size or $8\times10^{-16}$ F which means the gap in the open state has to be greater than N time 10 nm. If N is set at 20, then a gap of greater than 200 nm in the off state and a contact resistance of 325 Ohms per cantilever in the on state is needed. With two contacts per cantilever then each contact has to be around 600 Ohms.

If the pull in area of the cantilever is 8 by 5 microns and the pull in gap reduces to 100 nm, with a pull in voltage of 20 V the force is approximately $(A\varepsilon/2)*(V/d)^2$ or 70 uN. Thus, a contact resistance of 600 Ohms with a force of 35 uN per contact should be produced.

FIG. 1 shows a possible implementation of the resistively switched digital variable capacitor shown from the top. In this design, 1 marks where the RF pad will sit connected by the track to the shaded metal insulator metal capacitors. These are then connected to ground though the arrays of small switches 3 containing 20 or so small switches working in parallel (5). At the end of the array of switches there is a track 4 going to ground. 6 marks the Bit 0, 7 the Bit 1, 8 the Bit 2, 9 the Bit 3 and 10 the Bit 4. In one embodiment, the digital variable capacitor has one smaller Bit 0 MIM, one larger Bit 1 MIM, two larger Bit 2 MIMS, four larger Bit 3 MIMS, and eight larger Bit 4 MIMS. FIG. 1 is not exactly to scale, as one would want the number of small switches to scale with the size of the MIM so that the RC time constant would stay the same.

Figure 2A:
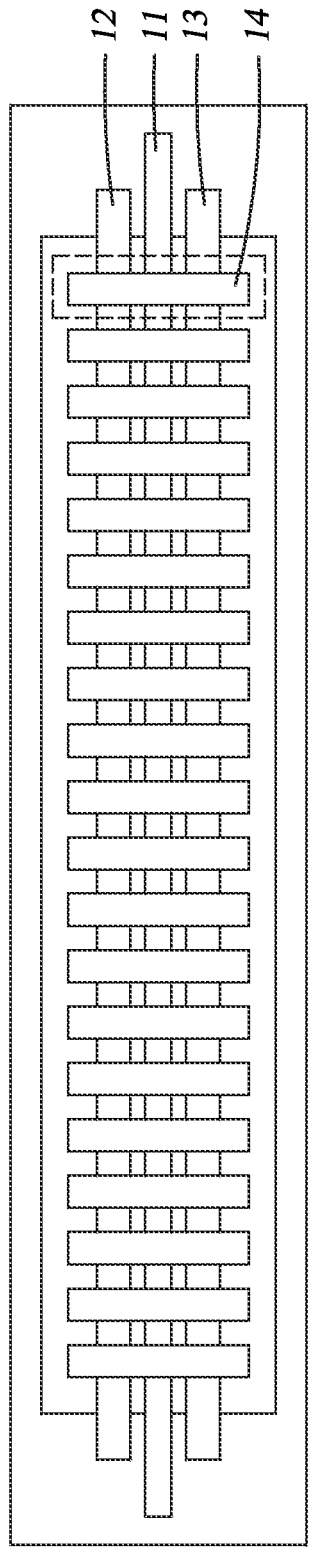
FIGS. 2A and 2B are schematic top and cross-sectional illustrations of the MEMS device of the MEMS DVC of FIG. 1.
Figure 2B:
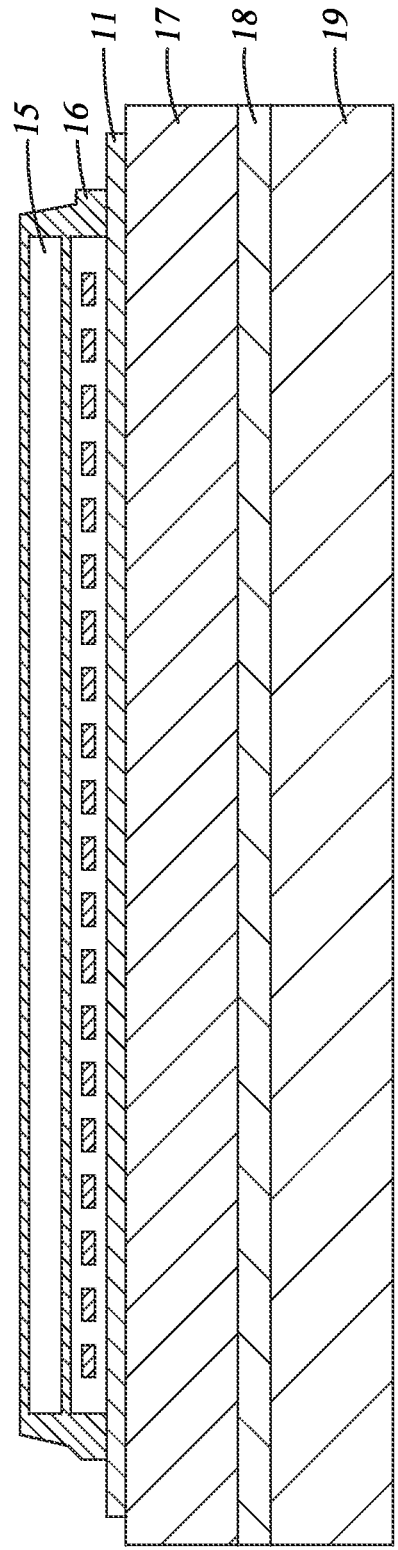

FIGS. 2A and 2B show the top and side view of the array of Ohmic switches as marked in FIG. 1 as 3. FIG. 2A is a top view of an array of switches as marked as 3 in FIG. 1. 11 marks the RF line running under the small switches which are marked as 14. 12 and 13 show the pull in electrodes. B shows the side view with pull up electrode 15, cavity 16 insulating layer 17 under the switches and RF line and 18 is a conductive ground plane. 19 is the underlying silicon substrate that may also have CMOS address circuits designed in it to operate the digital variable capacitor.

Figure 3A:
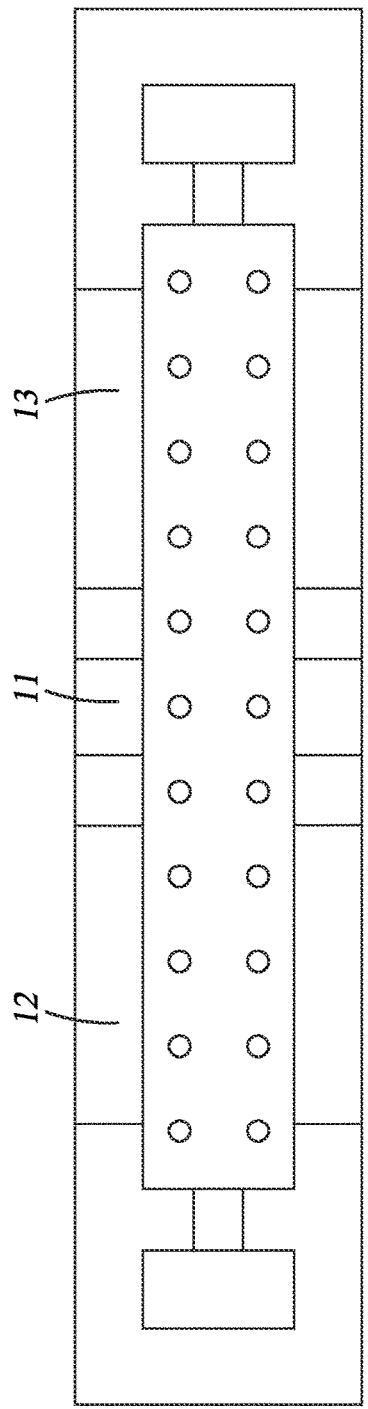
FIGS. 3A and 3B are schematic top and cross-sectional illustrations of an individual switching element in the MEMS device of the MEMS DVC of FIG. 1.
Figure 3B:
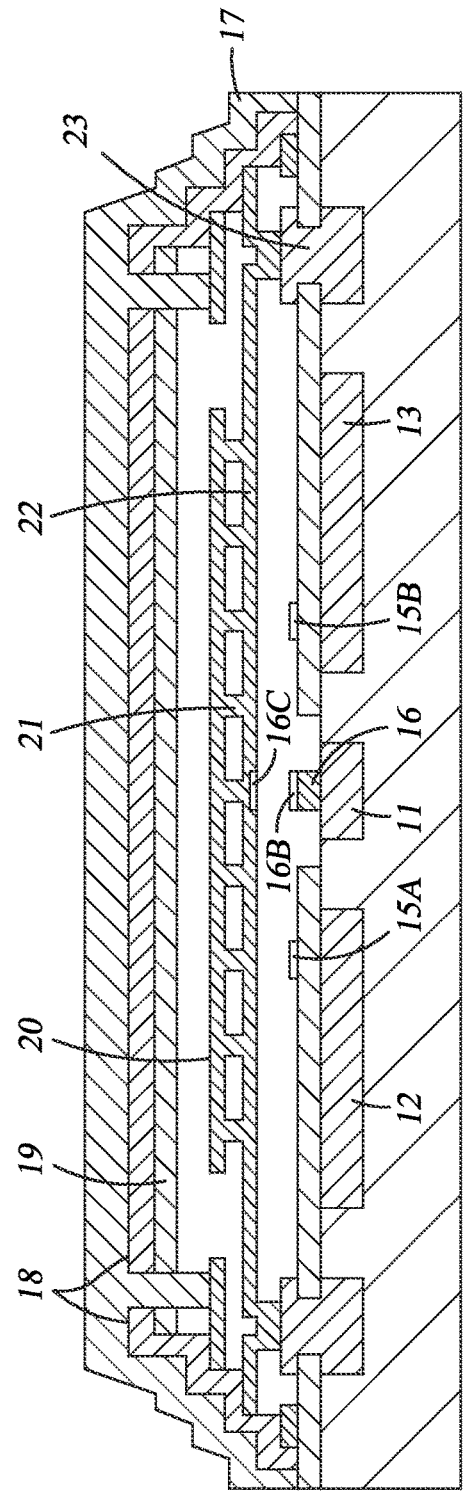

FIG. 3A shows a top view of one of the switches in the array marked as 14 in FIG. 2A and marked with a dotted line square in that FIGS. 12 and 13 mark the pull in electrodes while 11 is the RF line. Layer 22 of the MEMS bridge may land on bumps 15A and 15B. The two layers 20, 22 of the MEMS bridge are made from conducting material and are joined together using vias marked as 21. Layer 20 may not extend all the way to the ends of the structure, making layer 20 shorter in length than layer 22, as shown in FIG. 3B. The grounded MEMS bridge is connected to the underlying metallization though via 23. 19 is a top oxide capped with metal 18 which is used to pull the MEMS up to the roof for the off state. This helps reduce the capacitance of the switch in the off state. 17 marks the top oxide which fills the etch holes used to remove the sacrificial layers. It enters these holes and helps support the ends of the cantilevers, while also sealing the cavity so that there is a low pressure environment in the cavities. 16 indicates one of two landing posts that are conductive and make contact with the conducting underside of the cantilever. 16B is a surface material on the conducting post that provides good conductivity, low reactivity to the ambient materials and high melting temperature and hardness for long lifetime. The underside may be coated with an insulator but a window is opened on the underside of the cantilever to provide a conducting region 16C for the conducting post to make electrical contact with when the MEMS is pulled down.

Figure 4A:
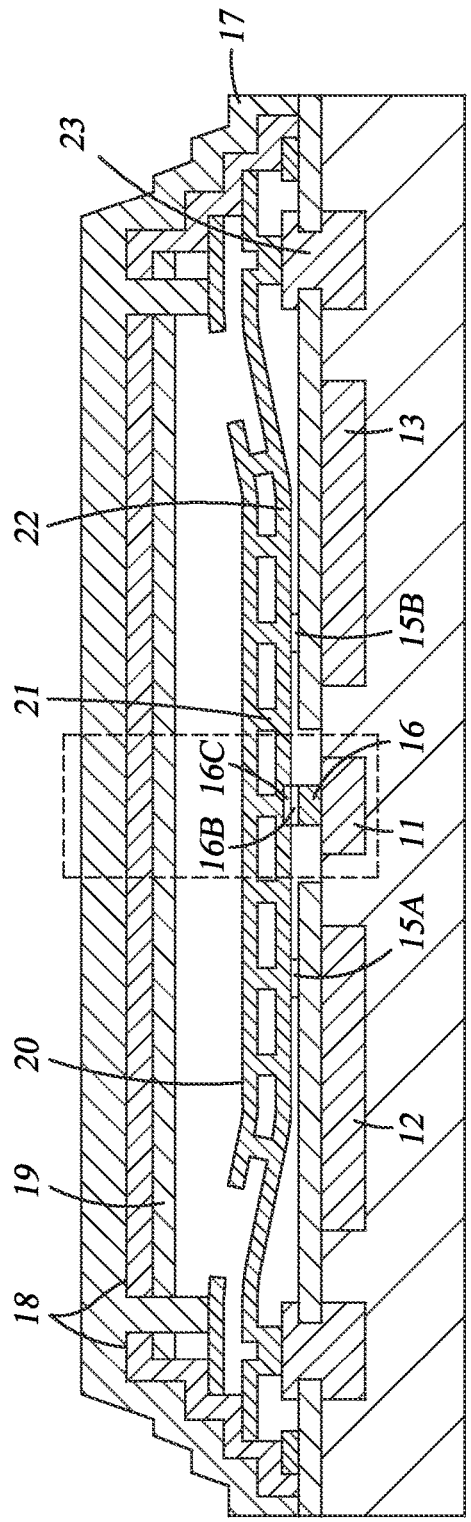
FIGS. 4A and 4B are schematic cross-sectional illustrations of the switching element of FIG. 3B in the $C_{max}$ and $C_{min}$ positions respectively.
Figure 4B:
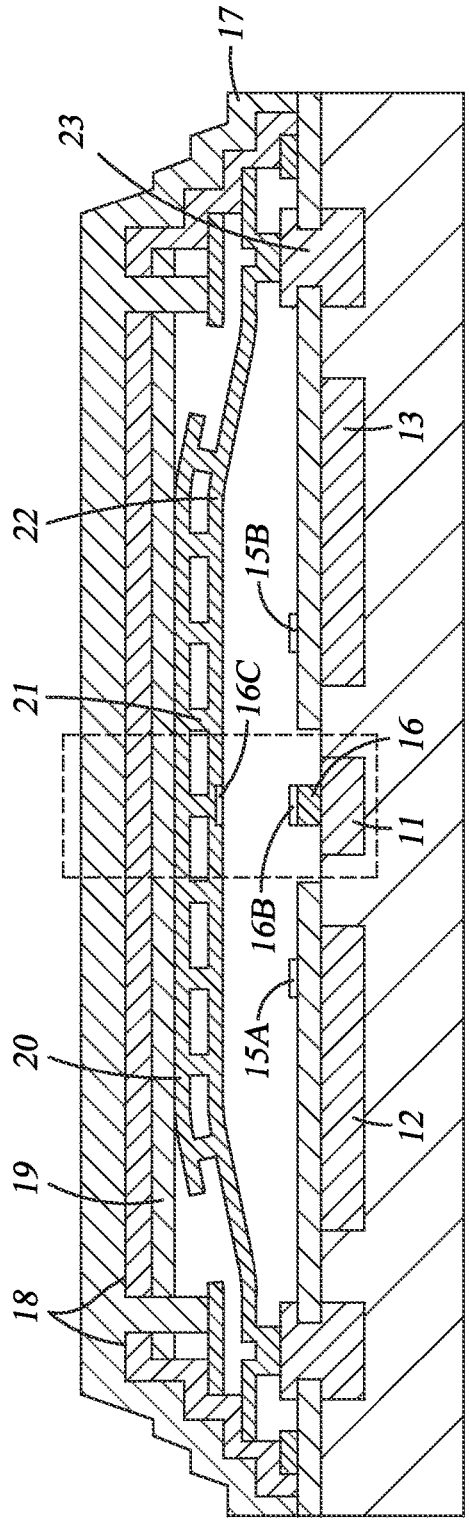

FIG. 4A shows the cantilever pulled in with voltages applied to 12 and 13 (FIGS. 3A and 3B) so that the layer 22 (FIG. 3B) land on the insulated bumps 15A and 15B (FIG. 3B). The conducting underside of the cantilever lands on the two conducting post (only one shown as the other is behind it) (16 in FIG. 3B). This gives the low resistance state. FIG. 4B shows the cantilever after it has been pulled to the roof using electrode 18 in FIG. 3B. It makes contact with the insulating layer 19 shown in FIG. 3B. This prevents any electrical contact between the pull up electrode and the cantilever. The region in the dotted rectangles is shown in FIGS. 5A and 5B.

Although not shown in these figures, there may be an insulating layer over the top and most of the underside of the cantilever. A hole is made in the insulator on the underside of the cantilever to allow it to make contact with the conducting post 16. In this state the resistance of the cantilever to the RF line is very large and the capacitance coupling to that line is small.

Figure 5A:
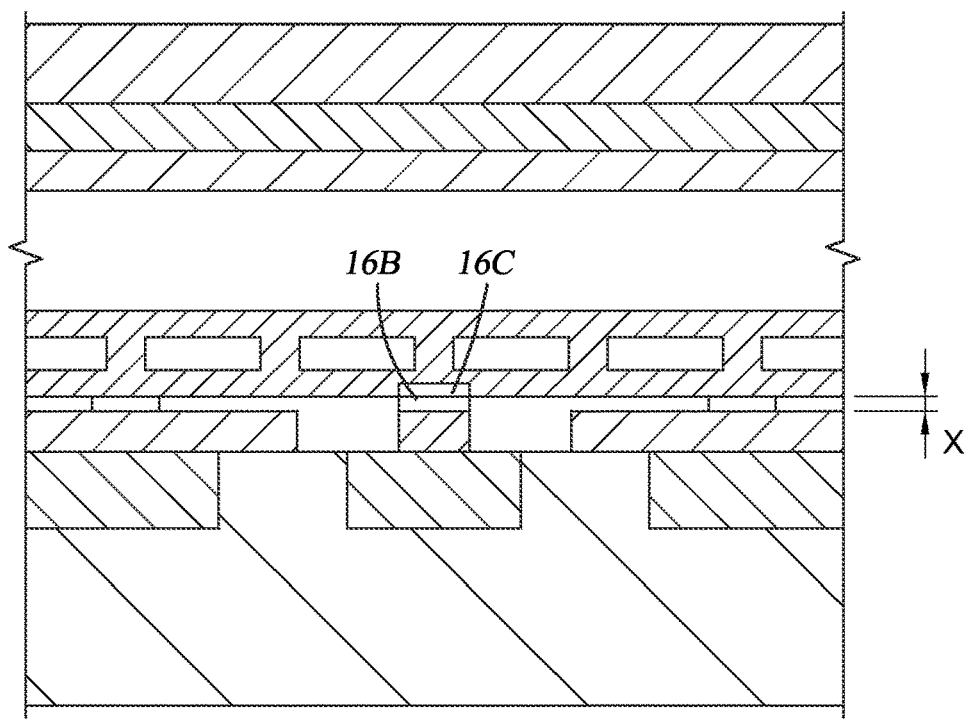
FIGS. 5A and 5B are schematic close-up cross-sectional illustrations of the switching element of FIGS. 4A and 4B respectively.
Figure 5B:
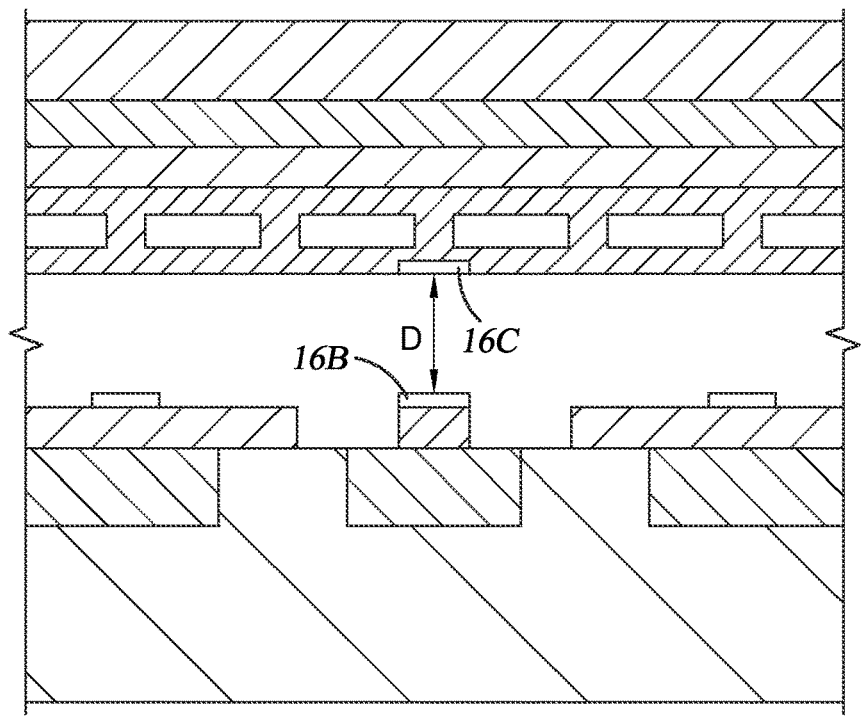

FIG. 5A shows a close up of the dotted rectangle in FIG. 4A and shows the cantilever in the up position with a gap D between the top of the contact and the bottom of the cantilever. FIG. 5B shows the same device in the down position with the cantilever making electrical contact to the conducting post, as shown in the dotted rectangle in FIG. 4B. The X marks the gap between the cantilever and the pull down electrode.

Figure 6:
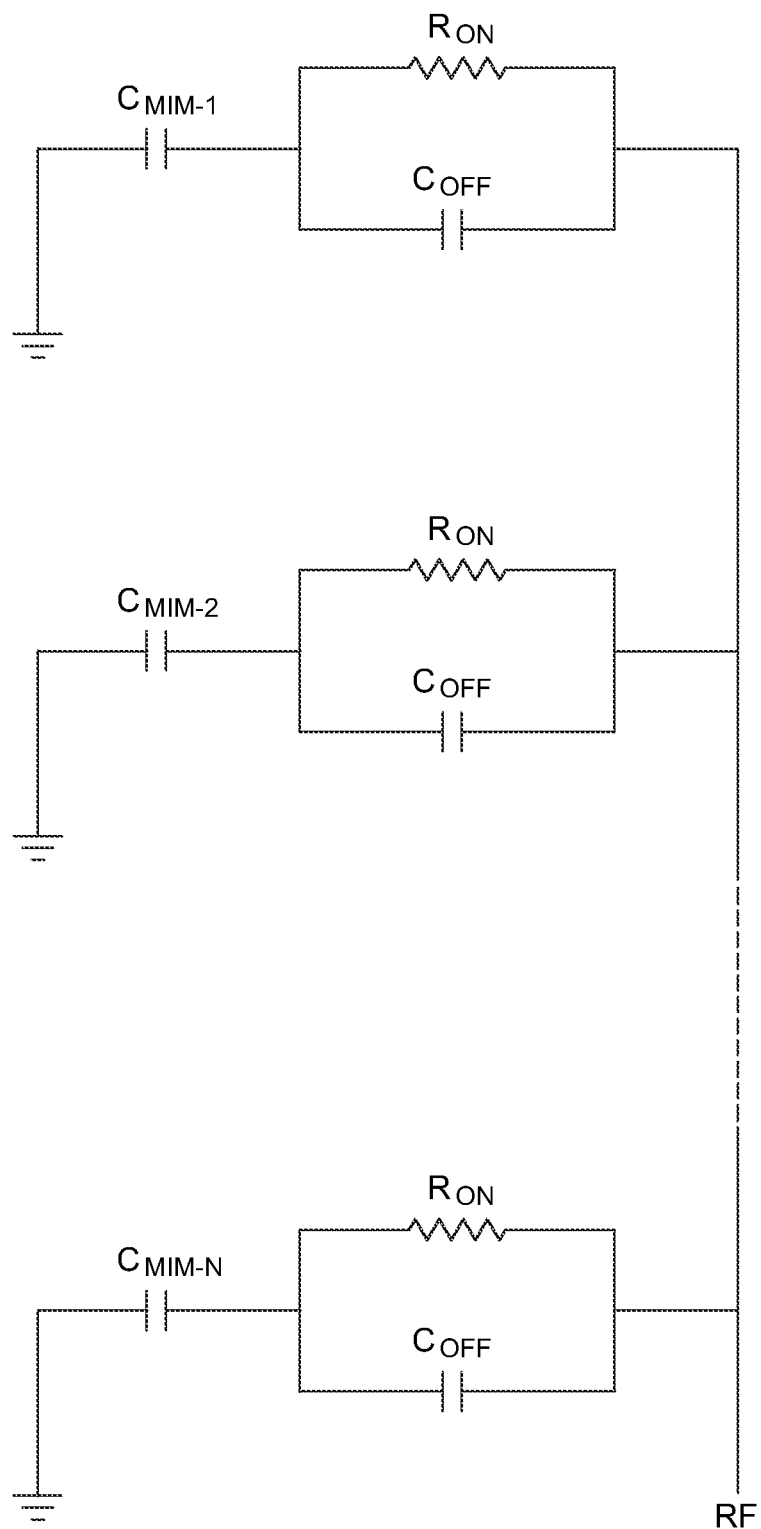
FIG. 6 is a schematic electrical diagram of the MEMS DVC of FIG. 1.

FIG. 6 shows a schematic of the device with the MIM capacitor $C_{MIM\ 1}$ connected to the array of MEMS cantilevers which switch one MIM capacitor and have a combined capacitance $R_{ON}$ when on and $C_{OFF}$ when off. When on, $R_{ON}$ is in series with $C_{MIM}$ and when off, $C_{OFF}$ is in series with $C_{MIM}$. $R_{ON}$ is the contact resistance of all the resistors in one array switching in parallel connected to one MIM capacitor. The MEMS acts like a switch and is either connected to the RF line or not connected to anything. $C_{MIM\ 1}$ refers to the first MIM capacitor while $C_{MIM\ N}$ refers to the Nth MIM capacitor.

The design is such that $R_{ON} \ll C_{MIM}$ and $C_{OFF} \ll C_{MIM}$. This means that when the MEMS cantilever is on, the capacitance between the RF line and ground is dominated by the $C_{MIM}$ value and when it is off it is dominated by $C_{OFF}$. The resistance will be dominated by $R_{ON}$ the combined resistance of all the contacts in parallel. The material for the contact has to be chosen so that it will last the billion cycles required for most products, and have a low contact resistance as well as being compatible with CMOS fabrication facilities.

To ensure the contacts are not contaminated it is important that they never see an ambient atmosphere which can lead to thin layers of organic material depositing over the contact. These provide a barrier for transport which can greatly increase the contact resistance. An insulating layer 0.2 nm thick can increase the resistance by a factor of 10 for some materials. To keep the contact clean, the MEMS device is fabricated in its own cavity. The sacrificial material is removed using a low pressure gas etch to remove it both above and below the MEMS switch leaving a cavity over the device and a small hole in the cavity close to the cantilever bridge anchors. In the same tool material is deposited, also at low pressures, which fills the cavity and seals a low pressure environment around the MEMS device.

The contact area will have a roughness to it so that the total area of the contact will not be physically touching. The tunneling rate through a vacuum from one metal to another drops more than 5 orders of magnitude when the spacing increases by one nanometer, so the resistance is dominated by the asperities that are in physical contact. The number and radius of these asperities will alter the contact resistance, so the metal processing has to be such that the asperity radius of curvature is small and that they are similar in size. The resistance of the contact will depend on the resistivity of the contact material and the area of contact of the asperities. It also depends on the force at each asperity. Increasing the contact force initially elastically deforms the asperities making the contact area large, increasing the force even more then leads to inelastic deformation which increases the area more leading to lower resistances. If the material is hard this inelastic increase in area with force is reduced.

Typically many contacts are made from gold because this does not contaminate easily and because the material is soft and it has a high conductivity. It is however not allowed in a CMOS fabrication facility and is thus not the best choice. Titanium nitride is a good material because it is already used in CMOS fabrication, where it is used as a barrier layer. It also does not tarnish easily and so the contact surface should have a low probability of contamination. It is a very hard material however, and its resistivity is not very low. One advantage of TiN is that it makes a very durable material for MEMS fabrication so it is possible to use the same material for the MEMS and contact resistance.

Because the contact resistance is dominated by the nature of the asperities at the contacts and because these will typically be less than 20 nm high, a sub 100 nm layer of material can be patterned over the bottom contact and in an area on the underside of the MEMS where the bottom contact touches the MEMS device when it is down.

Materials that are allowed in a CMOS fabrication facility or can already found in one that have low values of resistivity and do not react strongly with the environment, include: TiN, Tu, Pt, Ir, Rh, Ru, and Mo. TiN, Mo and Tu are materials that can be relatively easily etched, while the others do not etch quite so easily. They are all relatively hard and have high melting temperatures and they all have values of resistivity below $10^{-5}$ Ohmcm.

In order for the IP3 values to be low, it is important that the resistance of the contact does not alter with the power applied to the contact. Thus it is important to operate under high pressures on the asperities, where they have nearly fully deformed. Usually after contact the resistance of an asperity contact reduces quickly with extra force, however when a suitable force has been applied, the resistance stabilizes and is no longer strongly dependent on the applied force. This is the regime to be working in.

By choosing a harder film, the deformation remains in the elastic limit for longer, which ensures the higher asperities are providing and upward force to help separate the device when trying to switch the device off. Thus a material with the highest conductance, but also a high hardness value to help prevent issues related to adhesion is desired.

Increasing temperature can cause softening of the contacts and thus a change in the hardness. The heating can come from the current flow through the asperities. Thus, it is useful to have a material that has a high melting temperature.

One issue with resistive switches is the reduction of the contact lifetime due to arcing when the contact opens. This results from any stray inductance in the circuit which generates a voltage V that is given by $V=L(dI/dt)$. Thus it is important to reduce the stray inductance in the device design as well as reducing any unwanted sudden changes in current. By adding a controlled atmosphere of an inert gas like argon, we can damp any oscillation of the cantilever which can cause it to bounce on landing. Bouncing adds many more contact breaks than is requires and reduces the device lifetime.

By ensuring the cantilevers contacts are broken slowly, we can reduce the value of dI/dt. This can be achieved by ramping down absolute value of the pull in voltage to 0 and then turning on the pull up voltage. This allows the springs to prize the contacts apart, overcoming the adhesion forces and breaking one asperity contact at a time. As the current rapidly goes to zero once the contact is broken this process can be over in a few hundred nanoseconds and so will not slow the overall switching time much as this may be of the order of one or two microseconds. Having an array of switches switching at once also results in an average rate of change of current that is slower than for one large contact breaking quickly as each contact will break at a slightly different rate.

All MEMS Switches Become Hybrid Ohmic-MIM Devices

Figure 7:
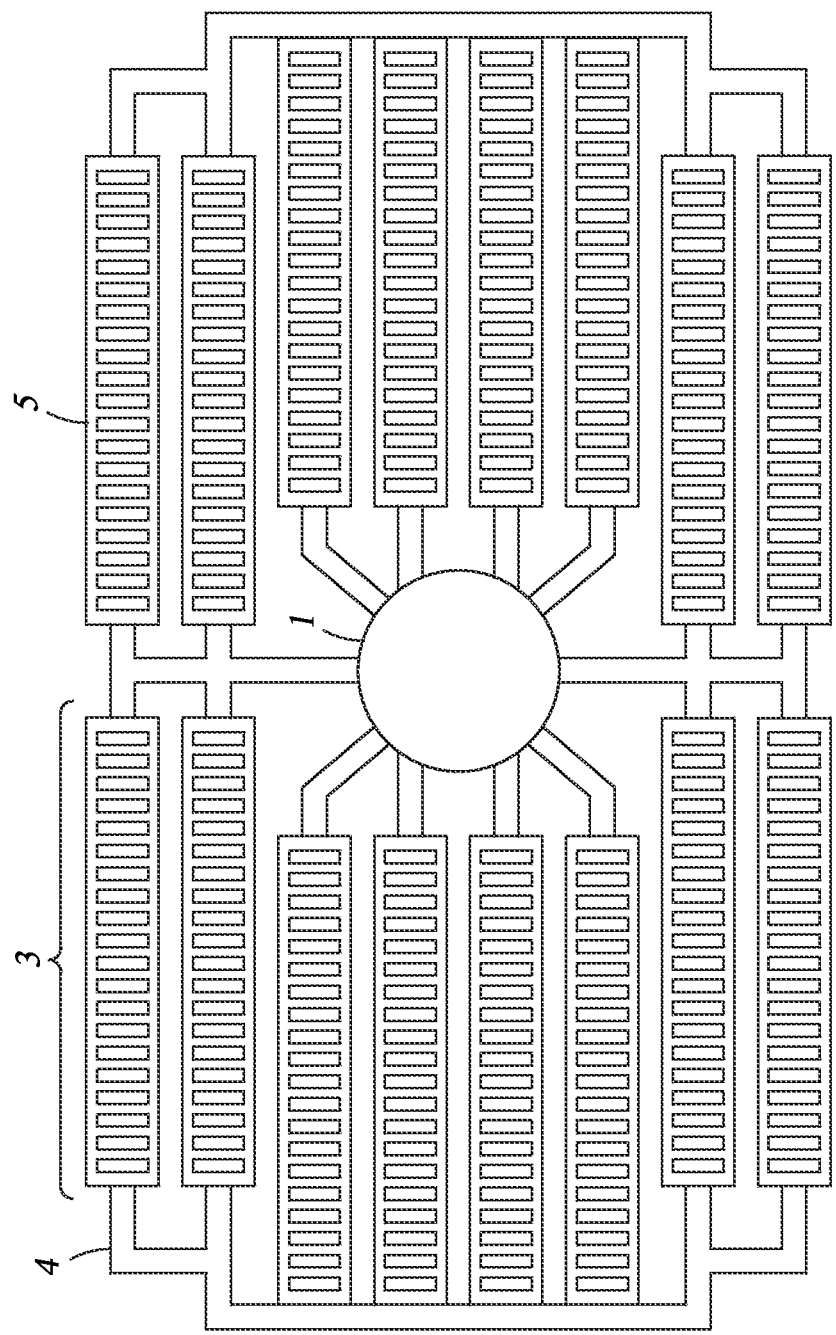
FIG. 7 is a schematic top view of a MEMS DVC according to another embodiment.

FIG. 7 shows a possible implementation of the resistively switched digital variable capacitor shown from the top. In this design, 1 marks where the RF pad will sit connected by the grey track to the arrays of small hybrid ohmic-MIM switches 3 containing 20 or so small switches working in parallel (5). At the end of the array of switches there is a track 4 going to ground.

Figure 8A:
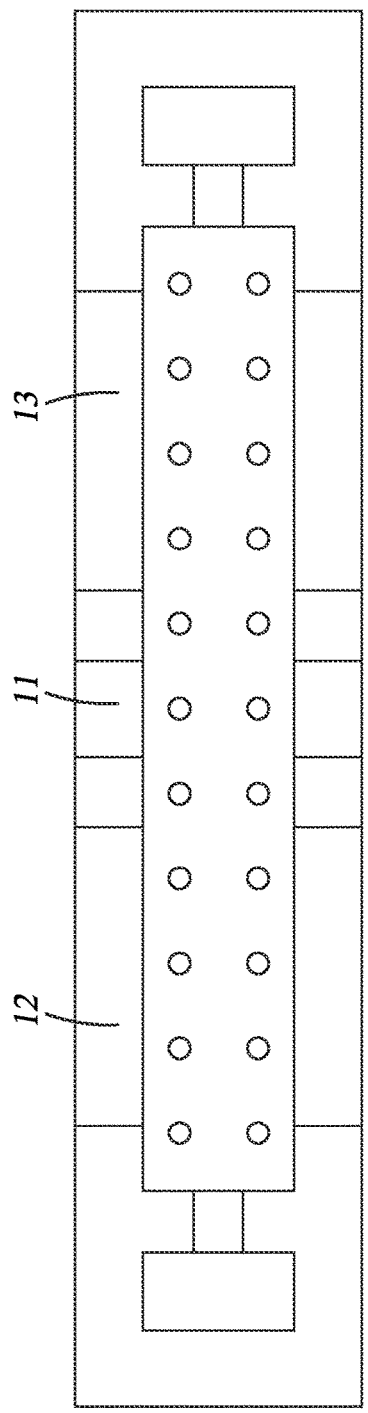
FIGS. 8A and 8B are schematic top and cross-sectional illustrations of the MEMS device of the MEMS DVC of FIG. 7.
Figure 8B:
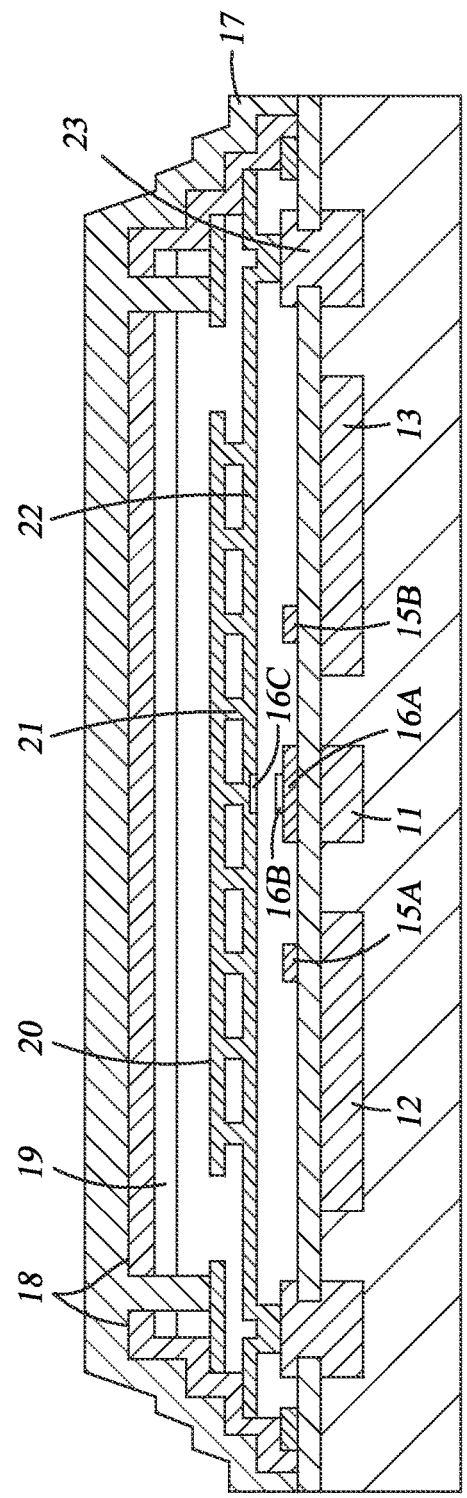

FIGS. 8A-8B show a top and cross section view of the hybrid ohmic-MIM MEMS switch in the array marked as 5 in FIGS. 7. 12 and 13 mark the pull in electrodes while 11 is the RF line. The MEMS bridge is made from layers 20 and 22. Layer 20 may not extend all the way to the ends of the structure, making layer 20 shorter in length than layer 22, as shown in FIG. 8B. The bridge lands on bumps 15A and 15B. The two layers of the MEMS bridge are made from conducting material and are joined together using vias marked as 21. The grounded MEMS bridge is connected to the underlying metallization though via 23. 19 is a top oxide capped with metal 18 which is used to pull the MEMS up to the roof for the off state. This helps reduce the capacitance of the switch in the off state. 17 marks the top oxide which fills the etch holes used to remove the sacrificial layers. It enters these holes and helps support the ends of the cantilevers, while also sealing the cavity so that there is a low pressure environment in the cavities. 16B indicates the landing post that is conductive and makes contact with the conducting underside of the cantilever. 16A is a surface material on the conducting post that provides good conductivity, low reactivity to the ambient materials and high melting temperature and hardness for long lifetime. The underside of the bridge may be coated with an insulator but a window is opened on the underside of the cantilever to provide a conducting region 16C for the conducting post to make electrical contact with when the MEMS is pulled down. 25 is a dielectric layer which is deposited on top of pull in electrodes 12 and 13 and on top of RF line 11. The metal feature 16B, the dielectric 25 and the RF line 11 implement a MIM capacitor. The top electrode of this MIM is either electrically floating, when the MEMS bridge is in UP position, or grounded via the ohmic contact between 16A and 16C, when the MEMS bridge is in DOWN position.

In an alternative embodiment, the metal feature 16A+16B, that is the top electrode of the MIM, is electrically connected to a reference DC potential by a variable resistor. The reference DC potential can be either the common ground, or a separate terminal of the device. The variable resistor can be implemented, as an example implementation, by a transistor or a separate higher resistance MEMS ohmic switch.

In a specific embodiment, a control logic will be used to set the value of the variable resistor, acting as follows. When the MEMS bridge (20+21+22) is in the UP or DOWN position, the variable resistor will normally be set to its highest value. This value will be designed so that the current flowing in the variable resistor will be significantly lower than the coupling between the MEMS bridge and the RF line 11. When the position of the MEMS bridge is changed from the DOWN to the UP position or from the UP to the DOWN position, the variable resistor will temporarily be set to its lowest value for a small length of time until the state transition is completed. This will reduce the electric field in the gap between the moveable bridge and the MIM-cap during the switching event which improves the hot-switch performance and avoids surface degradation.

There are several advantages in implementing the full device with a large number of small ohmic-MIM switches. Low capacitance means high impedance of the switch, small RF current flowing through the device for a given rms voltage; this minimizes reliability issues due to arcing during opening of the ohmic switch, since the current cannot go to zero instantaneously due to circuit level inductance in the application circuit. The intrinsic Q of the device is the ratio of 1/(omega*C) and the ohmic resistance of the switch; a small C (in the order of 5 to 10 fF) at for example 1 GHz gives a Q of 100 for a resistance of more than 100 ohms; in general, breaking up the device in a large number of branches each one made of a ohmic switch with a very small MIM in series relaxes the requirements for the ohmic resistance value in order to achieve an overall small equivalent series resistance (ESR) and high device Q factor.

Figure 9:
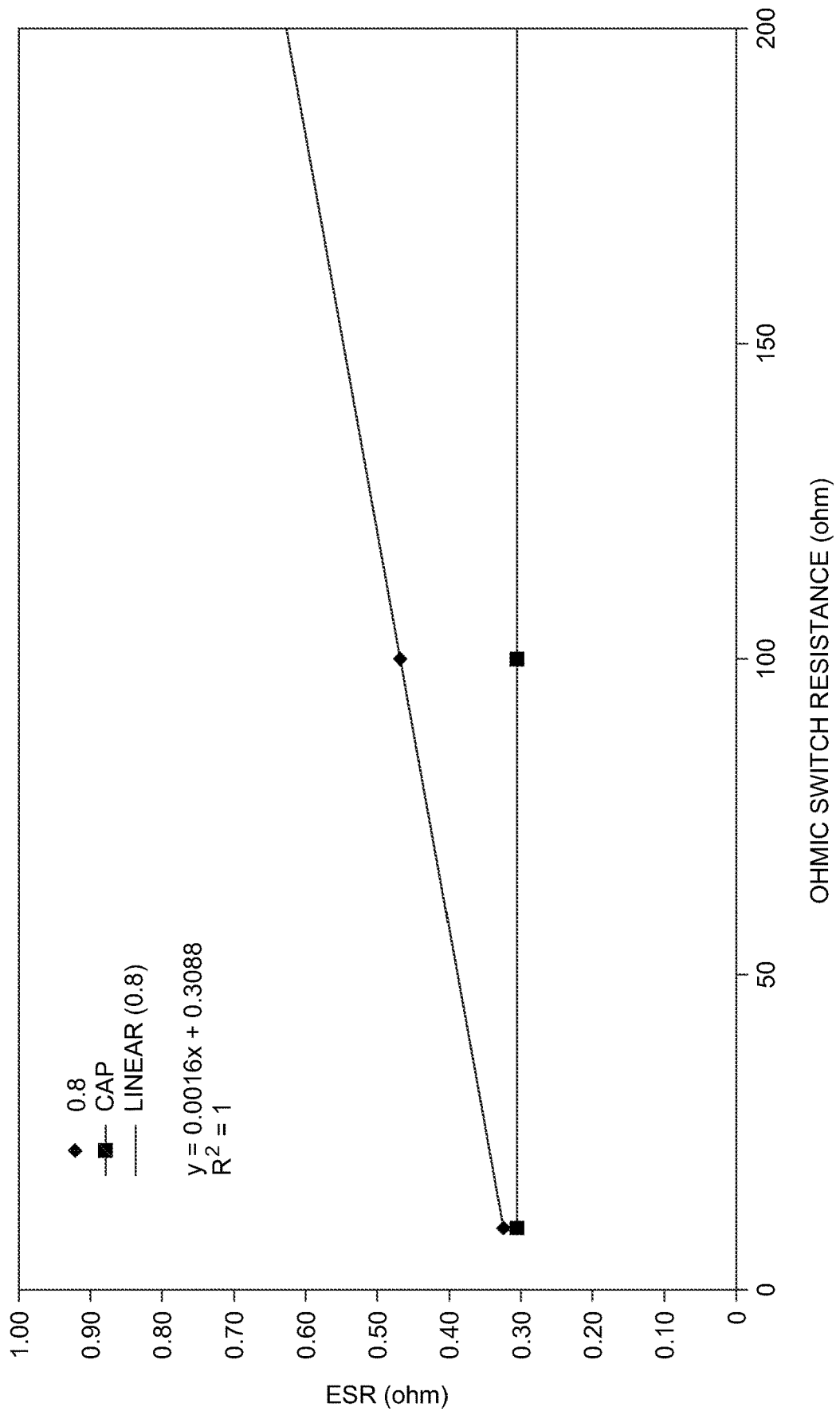
FIG. 9 is a graph comparing the resistance for the MEMS DVC of FIG. 1 and the MEMS DVC of FIG. 7.

FIG. 9 is a plot generated by a simulated analysis comparing an device implemented by just MIM capacitors (therefore of fixed capacitance value) with a device which introduces ohmic switches in series to all MIM's in order to obtain a programmable C value; the device ESR of the MIMs only is 0.3 ohm; adding the ohmic switches increases the ESR, but in order to have a ESR penalty of less than 0.1 ohm it is sufficient to have each ohmic switch resistance to be below 60 ohms; this is taking advantage of the parallelization in the architecture made of a large number of very small ohmic-MIM switches.

Advantages of having all switches becoming hybrid ohmic-MIM instead of the aforementioned split approach include: lower current across each ohmic contact, hence reduced arcing and sensitivity to power; more uniform current distribution across difference switches during transients (high impedance due to MIM); and reduced parasitics since all routing is used for capacitance instead of having MIM only+switch only routing.

MEMS DVC Fabrication

Figure 10A:
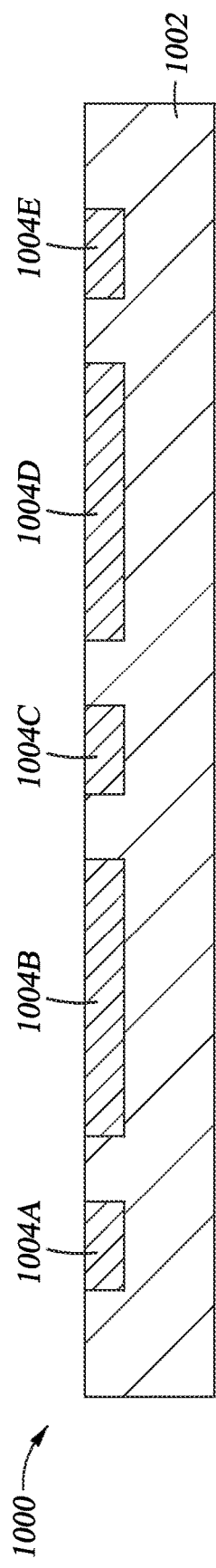
Figure 10B:
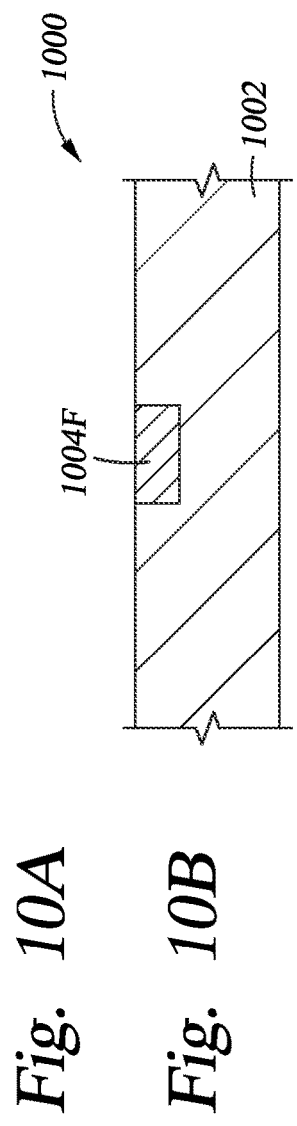

FIGS. 10A-10G are schematic illustrations of a MEMS DVC 1000 at various stages of fabrication according to one embodiment. As shown in FIGS. 10A and 10B, the substrate 1002 has a plurality electrodes 1004A-1004E formed therein and an electrically conductive material 1004F that will form the bottom "metal" of the MIM. FIG. 10A shows the MEMS device while FIG. 10B shows the MIM. The MIM is disposed on the same substrate 1002, but outside of the cavity of the MEMS device. The electrodes 1004A-1004E and the electrically conductive material 1004F may be formed during the same deposition and patterning process and thus, of the same material. Hence, the RF electrode 1004C is directly coupled to the electrically conductive material 1004F. It is contemplated that the electrodes 1004A-1004E and the electrically conductive material 1004F may comprise different materials and be formed in different processes. For example, it is contemplated that the electrodes 1004A-1004E are formed separate from the electrically conductive material 1004F and that the electrically conductive material 1004F is formed simultaneously with the RF pad such that the electrically conductive material 1004F is directly coupled to the pad.

It is to be understood that the substrate 1002 may comprise a single layer substrate or a multi layer substrate such as a CMOS substrate having one or more layers of interconnects. Additionally, suitable material that may be used for the electrodes 1004A-1004E and the electrically conductive material 1004F include titanium nitride, aluminum, tungsten, copper, titanium, and combinations thereof including multi-layer stacks of different material.

Figure 10C:
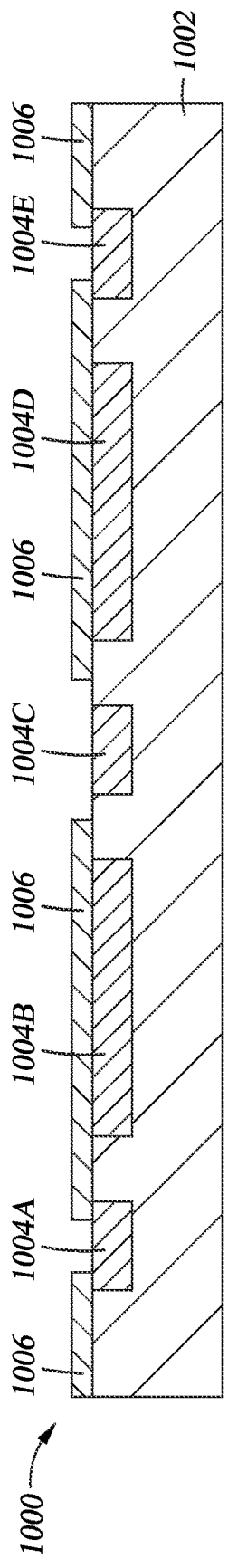
Figure 10D:
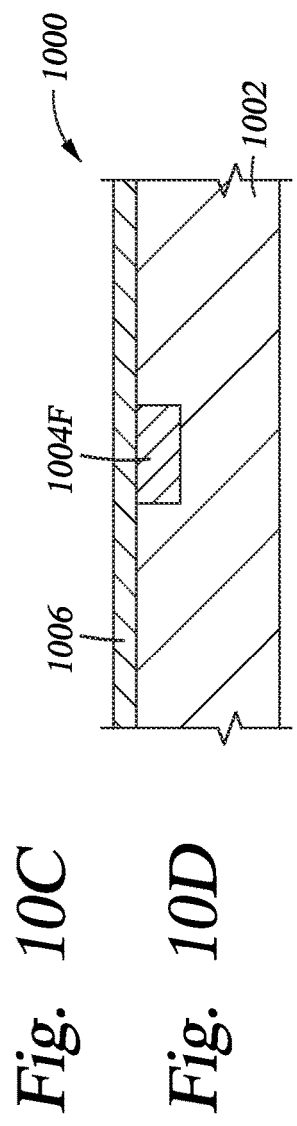

As shown in FIGS. 10C and 10D, an electrically insulating layer 1006 is then deposited over the electrodes 1004A-1004E and the electrically conductive material 1004F. Suitable materials for the electrically insulating layer 1006 include silicon based materials including silicon oxide, silicon dioxide, silicon nitride and silicon oxynitride. As shown in FIG. 10C, the electrically insulating layer 1006 is removed over the grounding electrodes 1004A, 1004E as well as from over the RF electrode 1004C to expose the underlying electrodes 1004A, 1004C, 1004E.

Electrically conductive material 1008 may then be deposited over the electrically insulating layer 1006. The electrically conductive material 1008 provides the direct electrical connection to the grounding electrodes 1004A, 1004E and to the RF electrode 1004C. Additionally, the electrically conductive material 1008 provides the upper "metal" in the MIM. In one embodiment, the upper metal of the MIM is spaced from and electrically disconnected from the MEMS device, yet directly connected to the RF pad. In another embodiment, the upper metal of the MIM is directly connected to the RF electrode 1004C while the bottom metal of the MIM is directly connected to the RF pad. Suitable materials that may be used for the electrically conductive material 1008 include titanium, titanium nitride, tungsten, aluminum, combinations thereof and multilayer stacks that include different material layers.

Once the electrically conductive material 1008 has been deposited and patterned, the remainder of the processing may occur to form the MEMS DVC 1000 shown in FIG. 10G. Specifically, the surface material 1010 may be formed over the electrically conductive material 1008 formed over the RF electrode 1004C to form an electrically conductive landing post. Additionally, electrically insulating landing structures 1012 may be formed over the electrically insulating layer 1006 to permit the switching element 1014 to land thereon when the switching element 1014 is in the $C_{max}$ position. As noted above, the switching element 1014 may have insulating material coating the bottom surface thereof and thus, an area 1024 of exposed conductive material may be present that will land on the surface material 1010. An additional electrically insulating layer 1018 may be formed over the pull-off (i.e., pull-up) electrode 1020, and a sealing layer 1022 may seal the entire MEMS device such that the switching element 1014 is disposed within a cavity. During fabrication, sacrificial material is used to define the boundary of the cavity.

Once fabricated, the MEMS DVC shown in FIGS. 10A-10G has an RF electrode 1004C that is directly connected to either the top or bottom metal of the MIM. Correspondingly, the other metal of the MIM that is not directly connected to the RF electrode 1004C is directly connected to the RF pad. Thus, the MIM capacitor can be formed simultaneously with the MEMS device for form a MEMS DVC.

Figure 11A:
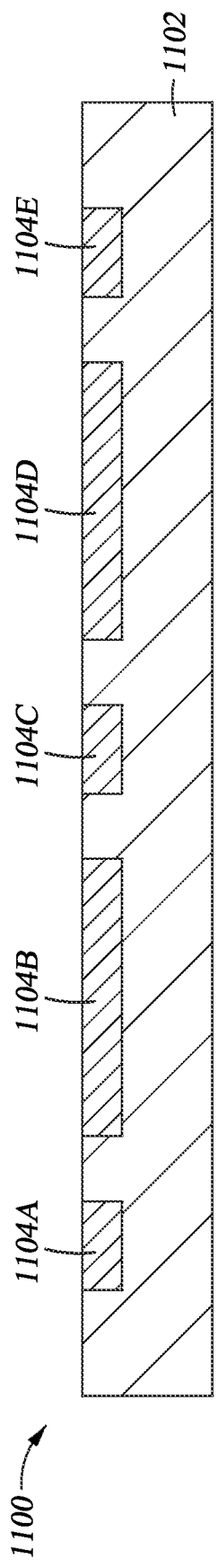
FIGS. 11A-11D are schematic illustrations of a MEMS DVC at various stages of fabrication according to another embodiment.
Figure 11B:
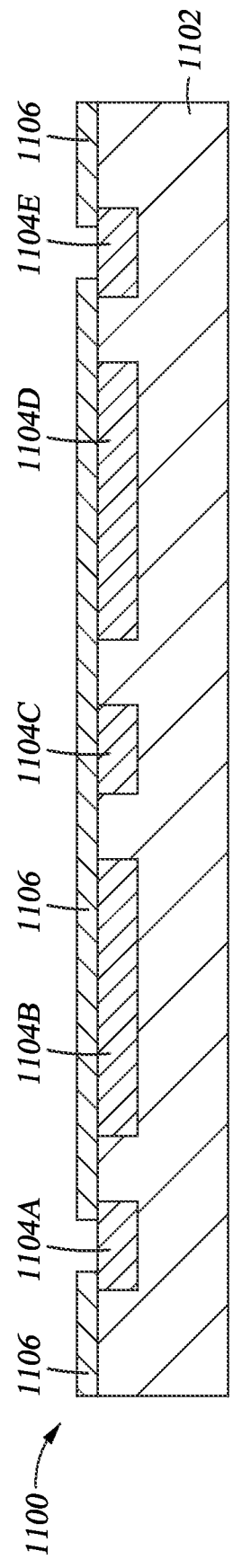

FIGS. 11A-11D are schematic illustrations of a MEMS DVC 1100 at various stages of fabrication according to another embodiment. The materials used for the MEMS DVC may be the same as those used for fabrication of the MEMS DVC 1000. As shown in FIG. 11A, electrodes 1104A-1104E are formed over the substrate 1102. Over the electrodes 1104A-1104E, an electrically insulating layer 1106 may be deposited and patterned to expose the ground electrodes 1104A, 1104E, as shown in FIG. 11B. The electrically insulating layer 1106 remains over the RF electrode 1104C as the MIM will be formed within the MEMS device in this embodiment.

Figure 11C:
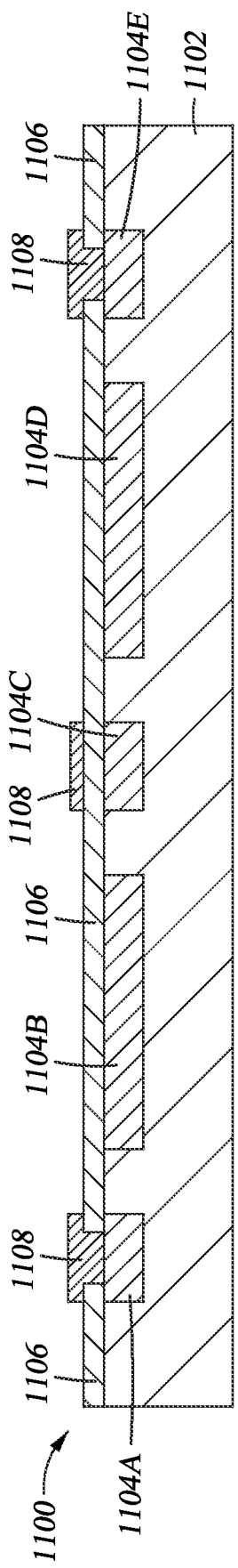

Electrically conductive material 1108 may then be deposited and patterned to form the electrical connection to the ground electrode 1104A, 1104E and to form the second metal of the MIM. As shown in FIG. 11C, the MIM is formed within the MEMS device rather than as a separate device outside of the cavity of the MEMS device.

Figure 11D:
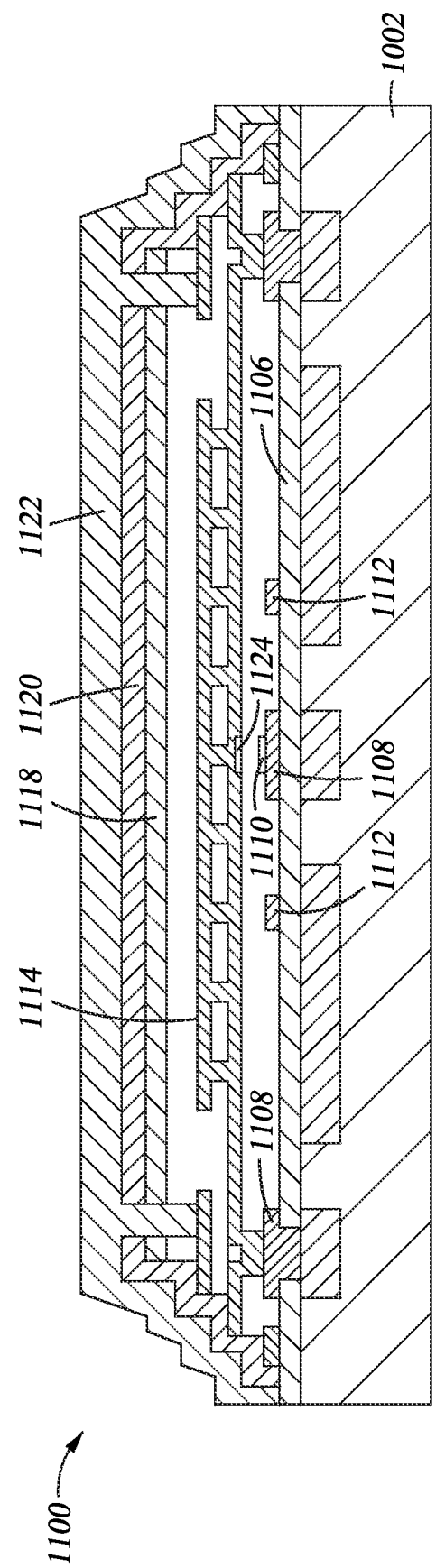

Once the electrically conductive material 1108 has been deposited and patterned, the remainder of the processing may occur to form the MEMS DVC 1100 shown in FIG. 11D. Specifically, the surface material 1110 may be formed over the electrically conductive material 1108 formed over the RF electrode 1104C to form an electrically conductive landing post. Additionally, electrically insulating landing structures 1112 may be formed over the electrically insulating layer 1106 to permit the switching element 1114 to land thereon when the switching element 1114 is in the $C_{max}$ position. As noted above, the switching element 1114 may have insulating material coating the bottom surface thereof and thus, an area 1124 of exposed conductive material may be present that will land on the surface material 1110. An additional electrically insulating layer 1118 may be formed over the pull-off (i.e., pull-up) electrode 1120, and a sealing layer 1122 may seal the entire MEMS device such that the switching element 1114 and MIM is disposed within a cavity. During fabrication, sacrificial material is used to define the boundary of the cavity. In one embodiment, each switching element 1114 (there could be one or many switching elements within a cavity) has a corresponding MIM structure within the cavity.

By using a MIM capacitor, either within or outside the cavity, the MEMS DVC will have a low resistance and thus, a consistent resonant frequency.

While the foregoing is directed to embodiments of the present invention, other and further embodiments of the invention may be devised without departing from the basic scope thereof, and the scope thereof is determined by the claims that follow.

The invention claimed is:

1. A MEMS DVC, comprising:
   a substrate;
   a plurality of pull-in electrodes disposed in the substrate;
   a plurality of pull-up electrodes disposed on an insulating layer;
   a conducting post disposed above a RF line, wherein a top surface of the conducting post is a metal material;
   a MEMS bridge device, wherein the MEMS bridge device has a upper layer and a lower layer coupled together by a conducting material, wherein the MEMS bridge device is movable, wherein the RF line and conducting post form a MIM capacitor, wherein the MIM capacitor contacts the MEMS bridge device through a window when the MEMS bridge device is in a lower positon; and
   bumps disposed on a layer that is disposed on and above the plurality of pull-in electrodes, wherein the MEMS bridge device contacts the bumps when the MEMS bridge is in a lower position, wherein the bumps are disposed between the MIM capacitor and a via.

2. The MEMS DVC of claim 1, wherein the MIM capacitor comprises the RF line, a first electrically conductive layer, an electrically insulating layer disposed on the RF line first electrically conductive layer, and a second electrically conductive layer disposed on the electrically insulating layer.

3. A method of making a MEMS DVC, comprising:
   depositing a RF pad over a substrate;
   forming a plurality of pull-in electrodes in the substrate;
   forming a plurality of pull-up electrodes on an insulating layer;
   forming a conducting post above a RF line, wherein a top surface the conducting post is a metal material;

forming bumps on a layer that is disposed on and above the plurality of pull-in electrodes; and forming a MEMS bridge device, wherein the MEMS bridge device has a upper layer and a lower layer coupled together by a conducting material, wherein the MEMS bridge device is movable, wherein the RF line and conducting post form a MIM capacitor substrate, wherein the MIM capacitor is electrically coupled to an RF electrode, wherein the MIM capacitor contacts the MEMS bridge device through a window when the MEMS bridge device is in a lower positon, wherein the MEMS bridge device contacts the bumps when the MEMS bridge is in a lower position, wherein the bumps are disposed between the MIM capacitor and a via.

4. The method of claim 3, wherein the MIM capacitor is formed by a method that comprises:
   depositing a first electrically conductive layer over the substrate;
   depositing a first electrically insulating layer over the first electrically conductive layer; and
   depositing a second electrically conductive layer over the first electrically insulating layer.

5. The method of claim 4, wherein the first electrically conductive layer comprises the RF line.

6. A method of making a MEMS DVC, comprising:
   depositing a RF pad over a substrate;
   forming a MEMS device within a cavity, the forming comprising:
      forming a MIM capacitor over the substrate, wherein the MIM capacitor is coupled to the RF pad; and
      forming one or more switching elements over the substrate, wherein the one or more switching elements are movable from a position in electrical contact with the MIM capacitor and a position spaced from the MIM capacitor; and
   forming a variable resistor connecting the MIM capacitor to a reference potential, further comprising setting the value of the variable resistor based upon the following logic:
      when the switching element is in an UP or DOWN position, the variable resistor will normally be set to its highest value so that the current flowing in the variable resistor will be significantly lower than the coupling between the switching element and the MIM capacitor; and
      when the position of the switching element is changed from the DOWN to the UP position or from the UP to the DOWN position, the variable resistor will temporarily be set to its lowest value until the state transition is completed.

7. The method of claim 6, wherein the MIM capacitor is formed by a method that comprises:
   depositing a first electrically conductive layer over the substrate;
   depositing a first electrically insulating layer over the first electrically conductive layer; and
   depositing a second electrically conductive layer over the first electrically insulating layer.

8. The method of claim 7, wherein the first electrically conductive layer comprises the RF line.

* * * * *